(12) United States Patent
Savandaiah et al.

(10) Patent No.: US 11,361,982 B2
(45) Date of Patent: Jun. 14, 2022

(54) METHODS AND APPARATUS FOR IN-SITU CLEANING OF ELECTROSTATIC CHUCKS

(71) Applicant: APPLIED MATERIALS, INC., Santa Clara, CA (US)

(72) Inventors: Kirankumar Neelasandra Savandaiah, Bangalore (IN); William R. Johanson, Gilroy, CA (US); David Gunther, San Jose, CA (US); Prashant Prabhakar Prabhu, Karwar (IN)

(73) Assignee: APPLIED MATERIALS, INC., Santa Clara, CA (US)

(*) Notice: Subject to any disclaimer, the term of this patent is extended or adjusted under 35 U.S.C. 154(b) by 390 days.

(21) Appl. No.: 16/708,908

(22) Filed: Dec. 10, 2019

(65) Prior Publication Data
US 2021/0175107 A1 Jun. 10, 2021

(51) Int. Cl.
H01L 21/68 (2006.01)
H01L 21/683 (2006.01)
B08B 3/12 (2006.01)
H01L 21/67 (2006.01)

(52) U.S. Cl.
CPC ............ H01L 21/6833 (2013.01); B08B 3/12 (2013.01); H01L 21/6704 (2013.01)

(58) Field of Classification Search
CPC .................................................. H01L 21/6833
See application file for complete search history.

(56) References Cited

U.S. PATENT DOCUMENTS

| 5,746,928 A | 5/1998 | Yen et al. |
| 5,861,086 A | 1/1999 | Khurana et al. |
| 5,911,833 A | 6/1999 | Denison et al. |
| 7,183,220 B1 | 2/2007 | Blalock et al. |
| 9,824,865 B2 | 11/2017 | Li et al. |
| 2001/0040091 A1 | 11/2001 | Khurana |
| 2006/0162739 A1 | 7/2006 | Sogard |
| 2014/0283872 A1 | 9/2014 | Deehan et al. |
| 2014/0366912 A1 | 12/2014 | Green et al. |

FOREIGN PATENT DOCUMENTS

JP 2001-326205 A 11/2001

OTHER PUBLICATIONS

International Search Report and Written Opinion for PCT/US2020/056447 dated Feb. 2, 2021.

Primary Examiner — Jason Y Ko
(74) Attorney, Agent, or Firm — Moser Taboada

(57) ABSTRACT

Methods and apparatus for cleaning an electrostatic chuck (ESC) in a semiconductor chamber allow in-situ cleaning of the ESC. An apparatus may include an adapter or cover ring that is electrically isolated from a deposition ring; an annular grounding bracket mounted to and surrounding a pedestal, the annular grounding bracket has at least one horizontal grounding loop on an upper perimeter surface configured to provide electrical contact with the adapter or cover ring and to provide an RF return path to the ESC during plasma generation; and a bracket with a horizontal grounding loop on a first end to make electrical contact with the deposition ring and a vertical grounding loop on a second end to make electrical contact with a lift hoop which is electrically grounded, the bracket is mounted to, but electrically isolated from, the annular grounding bracket.

20 Claims, 7 Drawing Sheets

METHODS AND APPARATUS FOR IN-SITU CLEANING OF ELECTROSTATIC CHUCKS

FIELD

Embodiments of the present principles generally relate to cleaning of electrostatic chucks used in semiconductor manufacturing processes.

BACKGROUND

In deposition processes associated with semiconductor manufacturing, material is deposited on substrates to help form structures on the substrate. However, even if the deposition is directed towards the substrate, deposition material is inevitably deposited on surrounding areas as well causing degraded performance of a processing chamber. In some processing chambers, electrostatic chucks (ESC) are used to hold the substrates using an electrostatic charge. As deposition material builds up on the ESC, the ESC loses the electrostatic charge holding the substrate which may lead to the substrate becoming unclamped to the ESC. To ensure that the electrostatic chucking forces are maintained, the ESC is generally removed from the deposition chamber and cleaned. The ex-situ cleaning of the ESC causes substantial downtime for the processing of the substrates due to the complexity of removing, cleaning, and then re-installing of the ESC.

Thus, the inventors have provided improved methods and apparatus to clean the ESC in-situ.

SUMMARY

Methods and apparatus for cleaning e-chucks in-situ are provided herein.

In some embodiments, an apparatus for cleaning an electrostatic chuck (ESC) in a semiconductor chamber may comprise a deposition ring surrounding a perimeter of and electrically connected to the ESC, an adapter or cover ring surrounding and interfacing with an outer perimeter of the deposition ring, the adapter or cover ring is electrically isolated from the deposition ring, an annular grounding bracket configured to be mounted to and surrounding a pedestal, the annular grounding bracket has at least one horizontal grounding loop on an upper perimeter surface which is configured to provide electrical contact with the adapter or cover ring and to provide an RF (radio frequency) return path to the ESC during plasma generation, and a bracket with at least one horizontal grounding loop on an upper surface of a first end configured to make electrical contact with the deposition ring and at least one vertical grounding loop on a side surface of a second end that is distal to the first end and configured to make electrical contact with a lift hoop which is electrically grounded, the bracket is configured to be mounted to, but electrically isolated from, the annular grounding bracket.

In some embodiments, the apparatus may further include wherein the deposition ring has at least one portion of at least one surface of the deposition ring coated with aluminum deposited by a twin wire arc spray, the at least one portion of at least one surface of the deposition ring configured to contact the at least one horizontal grounding loop of the bracket, wherein the at least one portion of at least one surface of the deposition ring includes a portion of a top surface and a portion of a bottom surface of the deposition ring, wherein the first end of the bracket is configured to be mounted to the annular grounding bracket using at least one, wherein fasteners used to mount the bracket to the annular grounding bracket are surrounded by ceramic sleeves that are configured to maintain electrical isolation between the bracket and the annular grounding bracket, wherein the at least one horizontal grounding loop of the bracket is configured to compress approximately 50% when in contact with the deposition ring, wherein the at least one vertical grounding loop of the bracket is configured to compress approximately 5% to approximately 10% when in contact with the lift hoop, wherein the annular grounding bracket has at least six horizontal grounding loops, wherein the at least one horizontal grounding loop of the bracket is radially inward of the at least one horizontal grounding loop of the annular grounding bracket, and/or wherein the annular grounding bracket is made of stainless steel.

In some embodiments, an apparatus for cleaning an electrostatic chuck (ESC) when installed in a semiconductor chamber may comprise an elongated bracket formed of stainless steel with a horizontal surface at a first end and a vertical surface at a second end distal to the first end, the elongated bracket configured to be mounted in a vertical position when installed in the semiconductor chamber and to be mounted to, but electrically isolated from, an annular grounding bracket at the first end; at least one first grounding loop electrically connected to the horizontal surface of the first end and configured to make electrical contact by compression when contacting a deposition ring; and at least one second grounding loop electrically connected to the vertical surface of the second end and configured to make electrical contact by compression when contacting a lift hoop.

In some embodiments, the apparatus may further include wherein the first end of the elongated bracket is configured to be mounted to the annular grounding bracket using at least one insulative spacer, wherein the at least one insulative spacer is a ceramic material, wherein the elongated bracket is configured to use fasteners to mount the elongated bracket to the annular grounding bracket that are surrounded by ceramic sleeves that are configured to maintain electrical isolation between the elongated bracket and the annular grounding bracket, wherein the at least one first grounding loop of the elongated bracket is configured to compress approximately 50% when contacting the deposition ring, wherein the at least one second grounding loop of the elongated bracket is configured to compress approximately 5% to approximately 10% when in contact with the lift hoop, and/or wherein the at least one first grounding loop of the elongated bracket is configured to be radially inward of at least one horizontal grounding loop of the annular grounding bracket when installed in the semiconductor chamber.

In some embodiments, the apparatus for cleaning an electrostatic chuck (ESC) in a semiconductor chamber may comprise a deposition ring surrounding a perimeter of and electrically connected to the ESC; an adapter or cover ring surrounding and interfacing with an outer perimeter of the deposition ring, the adapter or cover ring is electrically isolated from the deposition ring; an annular grounding bracket is configured to be mounted to and surrounding a pedestal, the annular grounding bracket has at least one horizontal grounding loop on an upper perimeter surface which is configured to provide electrical contact with the adapter or cover ring and to provide an RF (radio frequency) return path to the ESC during plasma generation; a bracket with at least one horizontal grounding loop on an upper surface of a first end configured to make electrical contact with the deposition ring and at least one vertical grounding loop on a side surface of a second end that is distal to the first end and configured to make electrical contact with a lift hoop which is electrically grounded, the bracket is configured to be mounted to, but electrically isolated from, the annular grounding bracket; and a controller configured to perform an in-situ cleaning process of the ESC by moving the lift hoop to a position that contacts the at least one vertical grounding loop of the bracket to ground the ESC and deposition ring through the bracket; forming a plasma in the semiconductor chamber with an RF bias applied to the ESC with an RF return path formed by the adapter or cover ring, annular grounding bracket, and the pedestal; and etching with the plasma a process film buildup from at least a portion of a surface of the deposition ring and at least a portion of a surface of the ESC to perform in-situ cleaning of the ESC and the deposition ring.

In some embodiments, the apparatus may further include wherein the deposition ring has at least one portion of at least one surface of the deposition ring coated with aluminum, the at least one portion of at least one surface of the deposition ring configured to contact the at least one horizontal grounding loop of the bracket.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
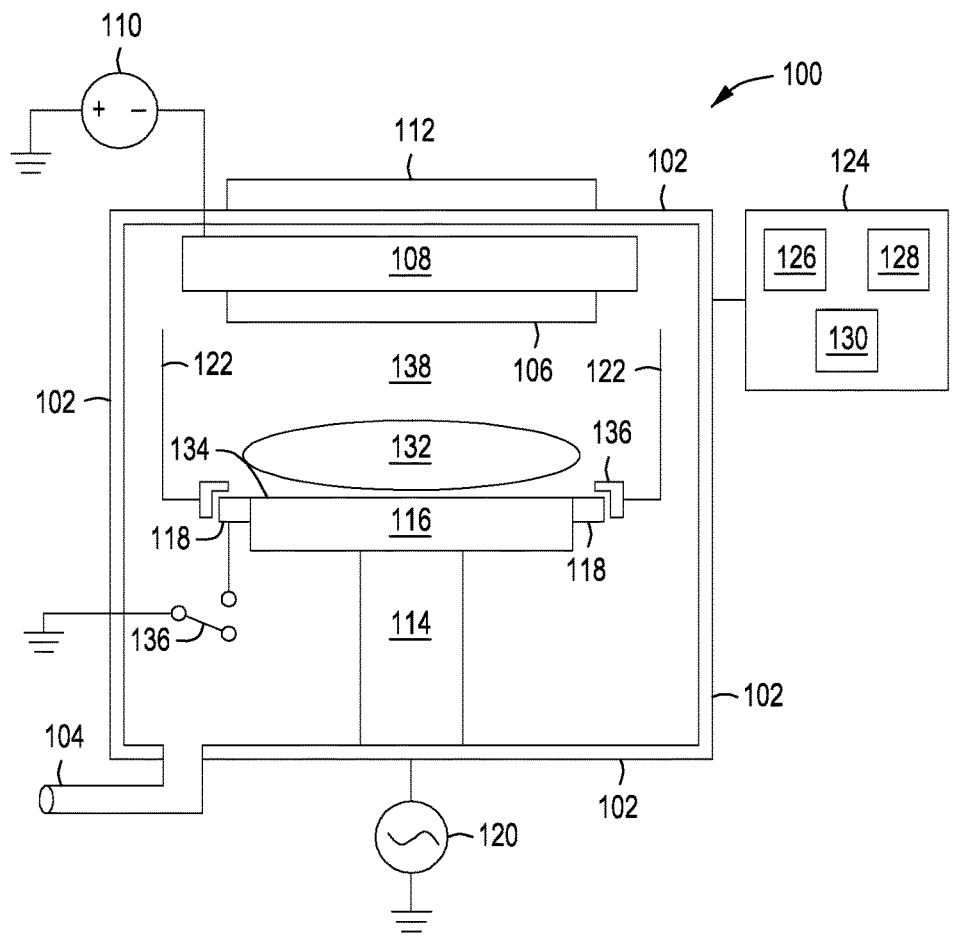
FIG. 1 depicts a cross-sectional view of a process chamber 100 according to some embodiments. of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide an in-situ process for cleaning electrostatic chucks, dramatically increasing production of substrates. The in-situ electrostatic chuck cleaning is compatible with existing bias hardware, operates at normal process temperatures, and provides on-demand electrical isolation or grounding for processes and cleaning. The electrostatic chuck cleaning process advantageously requires minimal time due to being in-situ and also due to utilizing deposition process compatible hardware, saving both time and cost. Another advantage is that the electrostatic cleaning process may also be used with RF bias equipped chambers (e.g., chambers equipped to perform 'gap filling' or other processes, etc.) such as, but not limited to, plasma vapor deposition (PVD) chambers without altering the existing deposition processes.

Due to the high power necessary (e.g., approximately 60 kW of DC power and higher) for depositing thick aluminum layers (e.g., greater than approximately three micrometers) and the like and the condition of incoming contaminated substrates, high temperature electrostatic chucks develop a film such as, for example, a carbon film on a top surface. Over time, a thin, approximately 10 nm to approximately 20 nm, film develops and starts to degrade the chucking capability of the electrostatic chuck. The film forms an electrically insulative barrier that reduces the effectiveness of the DC electrostatic charge on the electrostatic chuck that holds a substrate in place. The film needs to be removed to bring back the performance of the electrostatic chuck clamping. In current cleaning processes, the cleaning is performed ex-situ after a certain kilowatt-hours of deposition (e.g., approximately 400 kWh to approximately 3000 kWh) to remove the film buildup from the top surface of the electrostatic chuck.

The electrostatic chuck cleaning process of the present principles provides in-situ cleaning that removes the contamination film layer by using low energy sputtering. The sputtering etches the contamination film layer and removes the contamination film layer. The contamination film layer may be a conductive material layer such as, but not limited to, a carbon layer or a titanium layer and the like. The contaminants may be determined by the electrostatic chuck temperature, substrate backside type, and/or backside particles, etc. In some examples, the contamination film layer may comprise a carbon-based contamination film layer that becomes conductive graphite at high temperatures (e.g., 400 degrees Celsius or higher) when bombarded by ions.

In some embodiments, the electrostatic chuck cleaning process uses argon ions to bombard the contamination film layer which may be tens of angstroms thick on the electrostatic chuck surface. The electrostatic chuck cleaning process uses RF plasma created with RF bias power to lightly etch away the contaminants from the electrostatic chuck surface. In some embodiments, the RF bias power may operate at approximately 13.56 MHz. The RF bias power is generally equipped in deposition chamber used to bias or direct ions (e.g., gap fill processes) during deposition processes and would be readily available in many process chambers without modification. The contaminants that are etched or dislodged by the cleaning process are then evacuated from the process chamber by a chamber vacuum pump (see, e.g., vacuum pump 104 of FIGS. 1 and 2). In in-situ electrostatic cleaning processes with a deposition ring at a floating potential, the deposited film on the deposition ring may get sputtered back onto the electrostatic chuck, reforming the film contamination layer. The inventors have found that the sputtering of the deposition from an electrically floating deposition ring to the electrostatic chuck surface can be reduced or eliminated by electrically grounding the deposition ring during an electrostatic chuck cleaning process.

FIG. 1 is a cross-sectional view of a process chamber 100 according to some embodiments. The process chamber 100 includes chamber walls 102, a vacuum pump 104 for removing gases and/or contaminants from the process chamber 100, a sputter target 106 for depositing target material on a substrate, a target electrode 108 connected to a DC power supply 110, and a source magnetron 112 for uniform sputtering of the sputter target 106. A pedestal 114 supports an electrostatic chuck (ESC) 116 with a top surface 134. The electrostatic chuck 116 is surrounded on an outer perimeter by a deposition ring 118. A shield 122 surrounds a processing volume 138 to prevent unwanted deposition on surfaces other than the substrate and to provide an RF return path through a process kit assembly 136 for the RF power supply 120. The process kit assembly 136 may include an adapter and/or a cover ring. A controller 124 controls the operation of the process chamber 100 using a direct control or alternatively, by controlling computers (or controllers) associated with the process chamber 100.

In operation, the controller 124 enables data collection and feedback from the process chamber 100 to optimize performance of the process chamber 100. The controller 124 generally includes a Central Processing Unit (CPU) 126, a memory 128, and a support circuit 130. The CPU 126 may be any form of a general purpose computer processor that can be used in an industrial setting. The support circuit 130 is conventionally coupled to the CPU 126 and may comprise a cache, clock circuits, input/output subsystems, power supplies, and the like. Software routines, such as a method as described below may be stored in the memory 128 and, when executed by the CPU 126, transform the CPU 126 into a specific purpose computer (controller 124). The software routines may also be stored and/or executed by a second controller (not shown) that is located remotely from the process chamber 100.

The memory 128 is in the form of computer-readable storage media that contains instructions, when executed by the CPU 126, to facilitate the operation of the semiconductor processes and equipment. The instructions in the memory 128 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

During a deposition process, the DC power supply 110 provides power to the target electrode 108 to generate plasma 132 and sputter the target 106. The sputtering causes deposition of material onto a substrate on the electrostatic chuck 116 and portions of the top surface 134 of the electrostatic chuck 116. The deposition ring 118 will also have deposition material deposited on the deposition ring surfaces. The deposition ring 118 and the top surface 134 of the electrostatic chuck 116 are at a floating potential during deposition. If a cleaning process is attempted with the deposition ring 118 at a floating potential, the material deposited on the deposition ring 118 will re-sputter and cause re-deposition of the material onto the top surface 134 of the electrostatic chuck 116. The inventors have found that the deposition ring 118 should be grounded during the cleaning process to prevent re-sputtering but also be allowed to reach a floating potential during deposition processes. The inventors have discovered a configurable grounding process that provides a ground to the deposition ring 118 during a cleaning process and also allows a floating potential for the deposition ring 118 during a deposition process.

Figure 2:
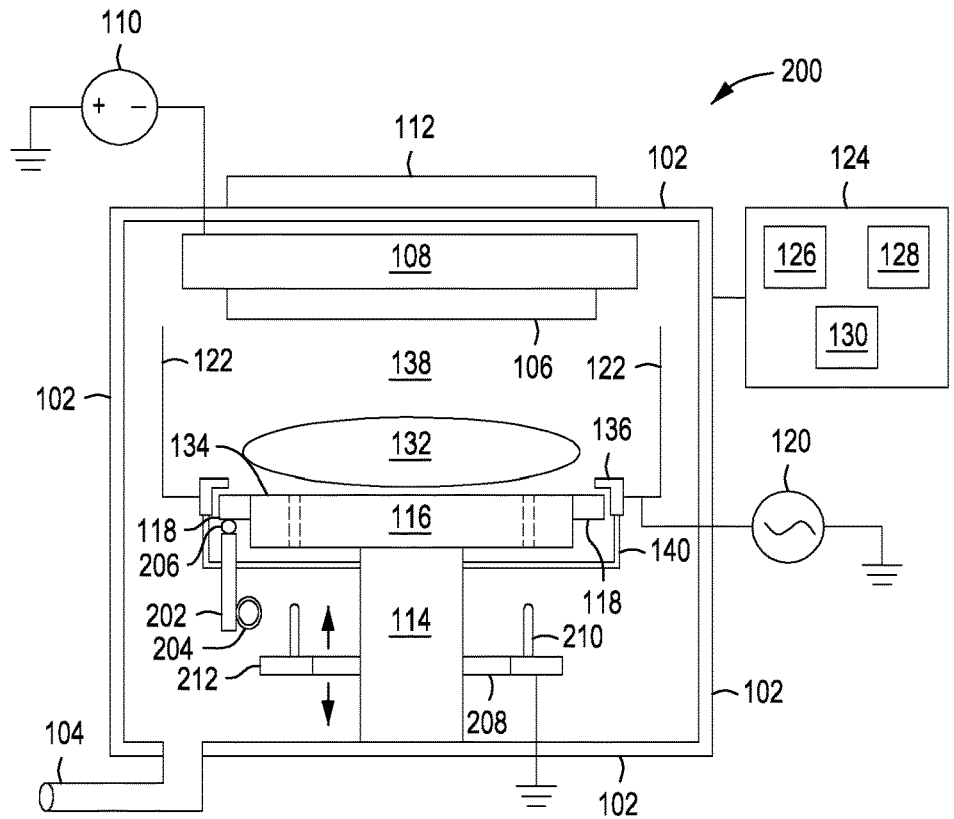
FIG. 2 depicts a cross-sectional view of a process chamber incorporating a bracket with a horizontal grounding loop and a vertical grounding loop in accordance with some embodiments of the present principles.
Figure 11:
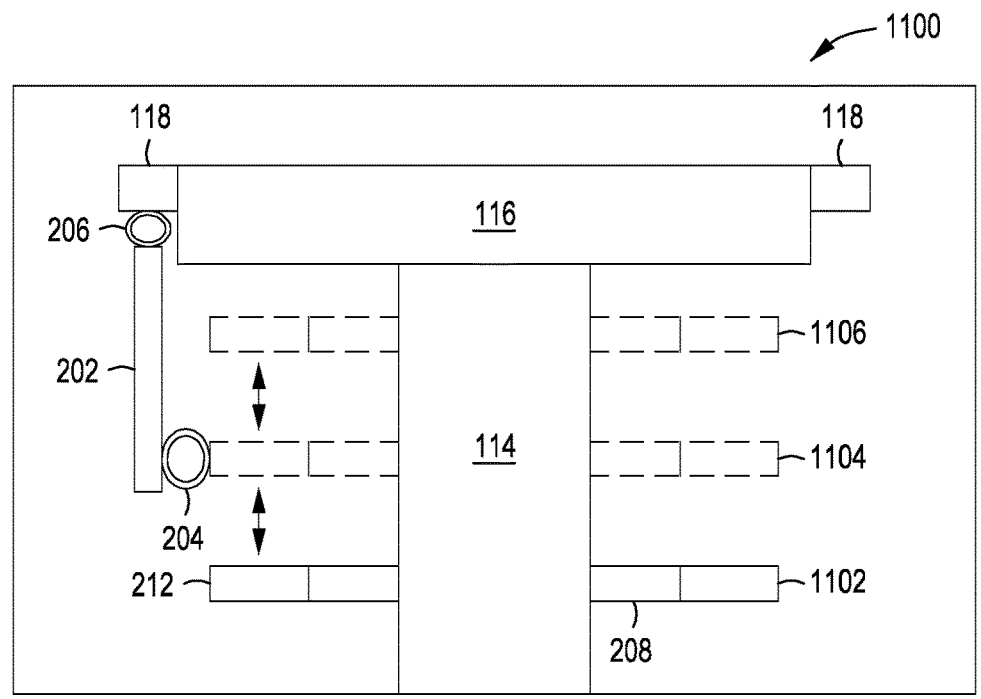
FIG. 11 depicts a cross-sectional view of lift hoop positioning in accordance with some embodiments of the present principles.

FIG. 2 is a cross-sectional view of a process chamber 200 that incorporates a configurable grounding process by using an in-situ cleaning bracket 202 with a horizontal grounding loop 206 and a vertical grounding loop 204. As used herein, the terms horizontal and vertical refer to orientations when an apparatus is installed in a process chamber. In some embodiments, a vertical grounding loop and/or a horizontal grounding loop may have a compressible shape that is circular, oval, or D-shaped. The horizontal grounding loop 206 provides an electrical connection between the deposition ring 118 and the in-situ cleaning bracket 202. The lift hoop 208 engages lift pins 210 that are used to lift a substrate off of the top surface 134 of the electrostatic chuck 116 after processing. FIG. 11 is a cross-sectional view 1100 that illustrates multiple positions of the lift hoop 208. When lifting a substrate, the lift hoop 208 will be in an uppermost position 1106 (see FIG. 11). During processing, the lift hoop 208 is lowered to a lowermost position 1102 (see FIG. 11) to allow a substrate to rest on the top surface 134 of the electrostatic chuck 116. The inventors have provided an additional 'cleaning position' 1104 (see FIG. 11) where an outer perimeter 212 of the lift hoop 208 makes contact with the vertical grounding loop 204 of the in-situ cleaning bracket 202. The vertical grounding loop 204 provides an electrical connection between the in-situ cleaning bracket 202 and the lift hoop 208 when the lift hoop 208 moves into the cleaning position 1104.

The lift hoop 208 is grounded and when the lift hoop 208 is in the cleaning position 1104, a grounding path is formed that includes the deposition ring 118, the horizontal grounding loop 206, the in-situ cleaning bracket 202, the vertical grounding loop 204, and the lift hoop 208. The grounding path can be broken during deposition processes to allow the deposition ring 118 to reach a floating potential by moving the lift hoop 208 to a position other than the cleaning position 1104. Processing chambers that also include an RF biasing power must also have an RF return path. The process kit assembly 136 surrounds the deposition ring 118 but is not electrically connected to the deposition ring 118 which is at a floating potential during processing or grounded during cleaning. The inventors found that by creating an annular grounding bracket 140, the annular grounding bracket 140 can be used to provide an RF return from the process kit assembly 136 to an RF ground path in the pedestal 114 while allowing a configurable grounding path for the deposition ring 118 to be formed by the in-situ cleaning bracket 202 and the lift hoop 208.

Figure 3:
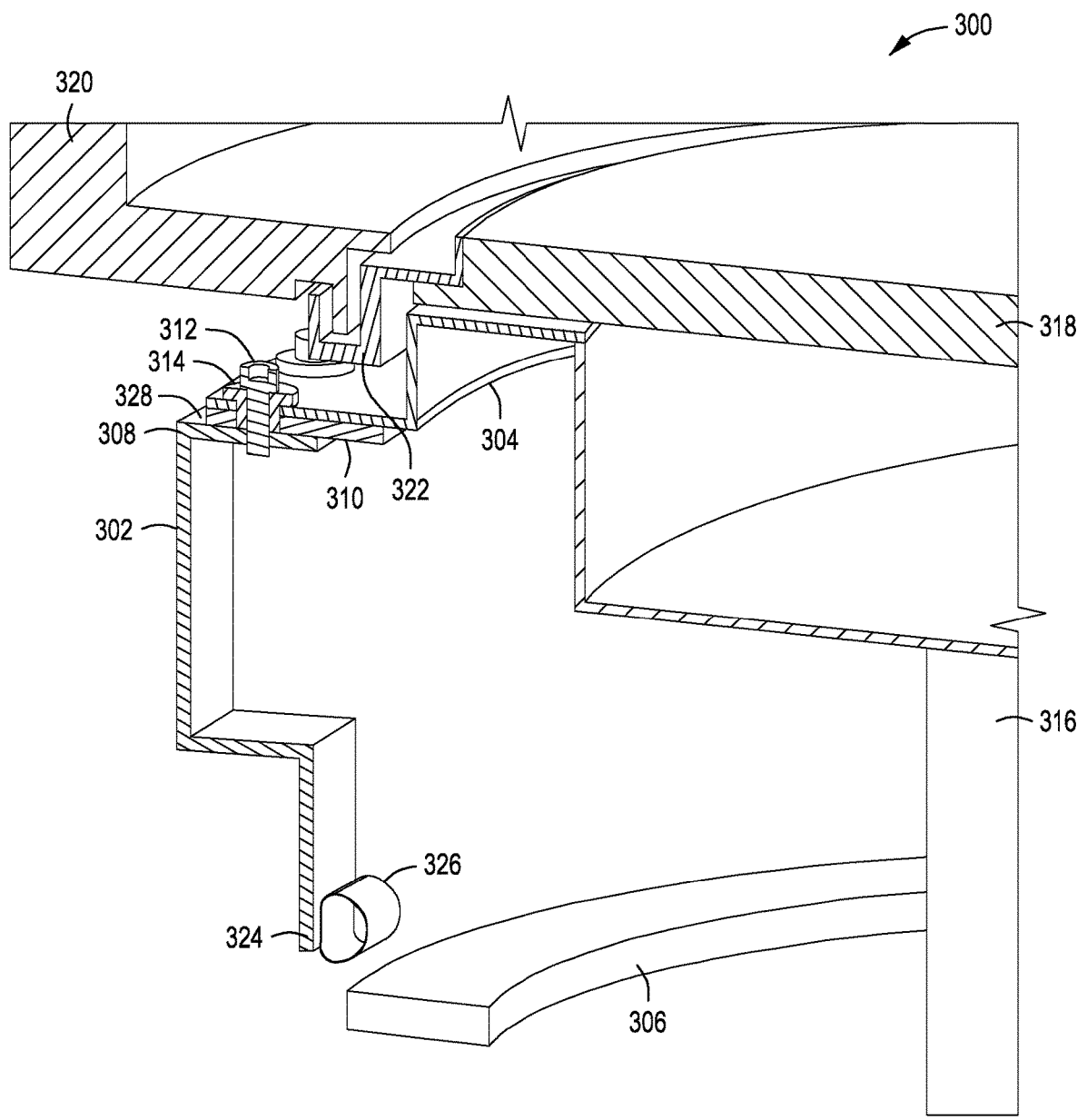
FIG. 3 depicts a cut-away view of an in-situ cleaning bracket interfacing with an annular grounding bracket and a lift hoop in accordance with some embodiments of the present principles.

FIG. 3 shows a cut-away view 300 of an in-situ cleaning bracket 302 interfacing with an annular grounding bracket 304 and a lift hoop 306. The in-situ cleaning bracket 302 has an elongated shape to facilitate providing a grounding path from a deposition ring 322 to a lift hoop 306. The in-situ cleaning bracket 302 has a first end 308 mounted to the annular grounding bracket 304 with an intervening electrically insulative spacer 310 and at least one fastener 312. In some embodiments, the at least one fastener 312 may also have an electrically insulative collar 314 that further assists in electrically isolating the in-situ cleaning bracket 302 from the annular grounding bracket 304. In some embodiments the electrically insulative spacer 310 and/or the electrically insulative collar 314 may be formed of a ceramic material. The annular grounding bracket 304 is mounted to and electrically connected to a pedestal 316 when installed in a processing chamber. The electrostatic chuck 318 is supported by the pedestal 316 but is electrically isolated from the pedestal 316. A process kit assembly 320 overlaps the deposition ring 322 but is electrically isolated from the deposition ring 322. The process kit assembly 320 may include an adapter and/or cover ring. The process kit assembly 320 makes electrical contact with the annular grounding bracket 304 via at least one grounding loop (see at least one grounding loop 404 in FIG. 4). In some embodiments, the process kit assembly 320 and/or the annular grounding bracket 304 may be made of aluminum. The process kit assembly 320, the annular grounding bracket 304, and the pedestal 316 provide an RF return path for bias current that is electrically isolated from deposition ring 322 and the in-situ cleaning bracket 302.

The in-situ cleaning bracket 302 is electrically connected to the deposition ring 322 by at least one horizontal grounding loop (see at least one horizontal grounding loop 402 of FIGS. 4, 5, and 7) mounted to an upper horizontal surface 328 of the first end 308. As used herein, the terms horizontal and vertical refer to orientations when an apparatus is installed in a process chamber. The in-situ cleaning bracket 302 has a second end 324 distal to the first end 308 with at least one vertical grounding loop 326 that is configured to electrically interface with the lift hoop 306 when the lift hoop 306 is moved into a cleaning position. In some embodiments, the at least one vertical grounding loop may be made of stainless steel. The deposition ring 322 is electrically connected to the electrostatic chuck 318 and has a floating potential during deposition processes. When the lift hoop 306 is brought into electrical contact with the at least one vertical grounding loop 326 of the in-situ cleaning bracket 302, the deposition ring 322 and the electrostatic chuck 318 are grounded through the in-situ cleaning bracket 302 and the lift hoop 306 which is electrically connected to ground. In some embodiments, the in-situ cleaning bracket 302 may have one or more bends between the first end 308 and the second end 324 to accommodate interior spaces or assemblies in a process chamber.

Figure 4:
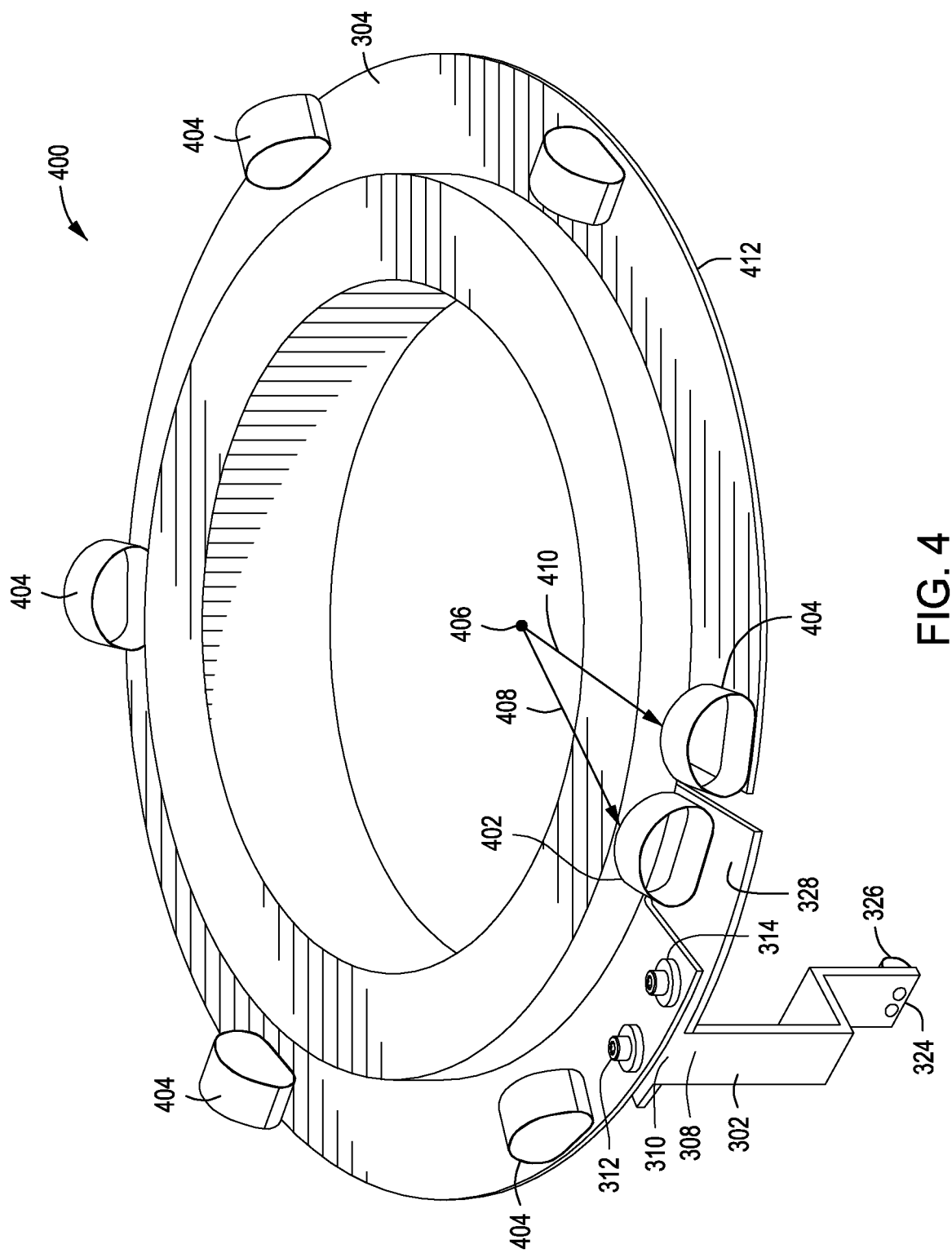
FIG. 4 depicts an isometric view of an annular grounding bracket in accordance with some embodiments of the present principles.

FIG. 4 is an isometric view 400 of the annular grounding bracket 304. In some embodiments, the annular grounding bracket 304 may be comprised of a stainless steel or aluminum-based material. The annular grounding bracket 304 has at least one grounding loop 404 that is configured to make electrical contact with the process kit assembly 320 (shown in FIG. 3) to provide an RF return path (e.g., for an RF bias current or VHF current, etc.). In some embodiments, the at least one grounding loop 404 may be made of a stainless steel material. In some embodiments, a grounding loop may have a compressible shape that is circular, oval, or D-shaped. The in-situ cleaning bracket 302 mounts to the annular grounding bracket 304 with the electrically insulative spacer 310 and remains electrically isolated from the annular grounding bracket 304 and any RF current returning through the annular grounding bracket 304. In some embodiments, the at least one horizontal grounding loop 402 that is configured to electrically interface with the deposition ring 322 is offset radially inward (closer to the center point 406 of the annular grounding bracket 304, line 408 is shorter than line 410) from the at least one grounding loop 404 of the annular grounding bracket 304. The offset allows the at least one horizontal grounding loop 402 to make electrical contact with the deposition ring 322 which is inset from the process kit assembly 320 (which contacts the at least one grounding loop 404 of the annular grounding bracket 304). In some embodiments, the at least one horizontal grounding loop 402 may be made of stainless steel.

Figure 5:
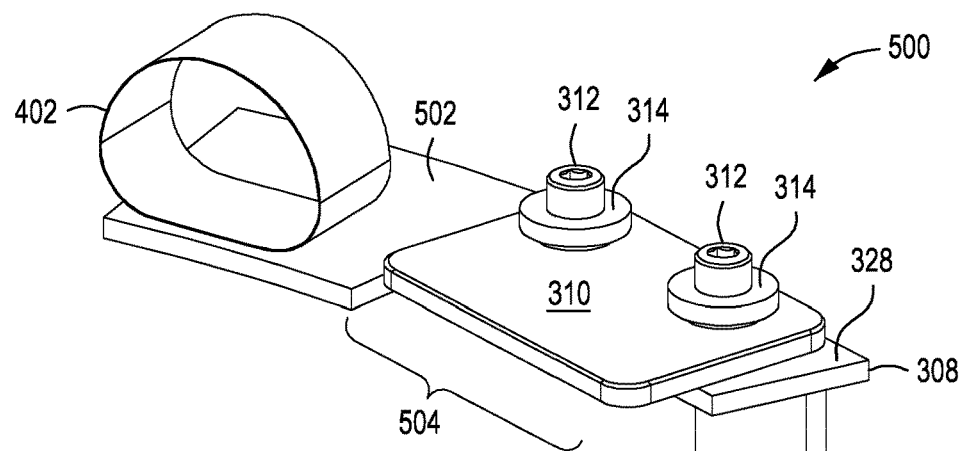
FIG. 5 depicts an isometric view of an in-situ cleaning bracket in accordance with some embodiments of the present principles.
Figure 6:
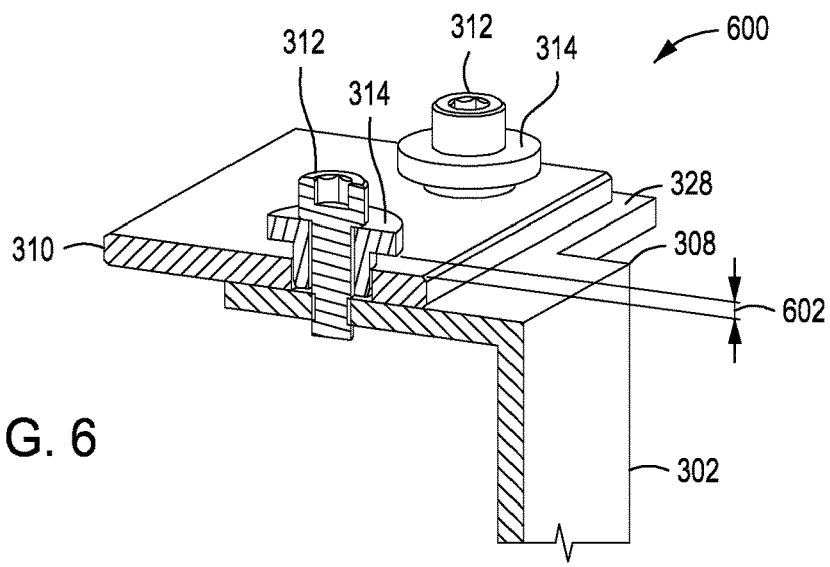
FIG. 6 depicts an isometric view of a first end of an in-situ cleaning bracket in accordance with some embodiments of the present principles.

FIG. 5 is an isometric view 500 of the in-situ cleaning bracket 302. The upper horizontal surface 328 includes an extended portion 502. The at least one horizontal grounding loop 402 is mounted to the extended portion 502 to provide electrical isolation from a mounting portion 504 that interfaces with the annular grounding bracket 304. In some embodiments, the at least one horizontal grounding loop 402 has a compression force less than a downward force exerted by a weight of the deposition ring 322. The inventors have found the compression force of the at least one horizontal grounding loop 402 should allow minimal contact and not produce a back-reaction force that would move or lift the deposition ring 322. The at least one horizontal grounding loop 402 is positioned on the extended portion 502 such that the at least one horizontal grounding loop 402 is radially inward of the at least one grounding loop 404 of the annular grounding bracket 304. In some embodiments, the annular grounding bracket 304 will have a cutout or relief in a perimeter of the annular grounding bracket 304 (see FIG. 4) to allow the at least one horizontal grounding loop 402 to protrude past the annular grounding bracket 304 outermost perimeter 412 and make contact with the deposition ring 322. The at least one horizontal grounding loop provides a secure method to contact the deposition ring 322 without relying on close-tolerance parts to prevent arcing and/or particle generation such as when clips are used to fasten a bracket to a deposition ring. The spring tension of a clip may also be lost due to flexing and heat and allow parts to move during processing which causes arcing and particle generation. FIG. 6 is an isometric view 600 of the first end 308 of the in-situ cleaning bracket 302. In some embodiments, the electrically insulative collar 314 will have a gap 602 to accommodate a thickness of the annular grounding bracket 304 when the in-situ cleaning bracket 302 is mounted to the annular grounding bracket 304.

Figure 7:
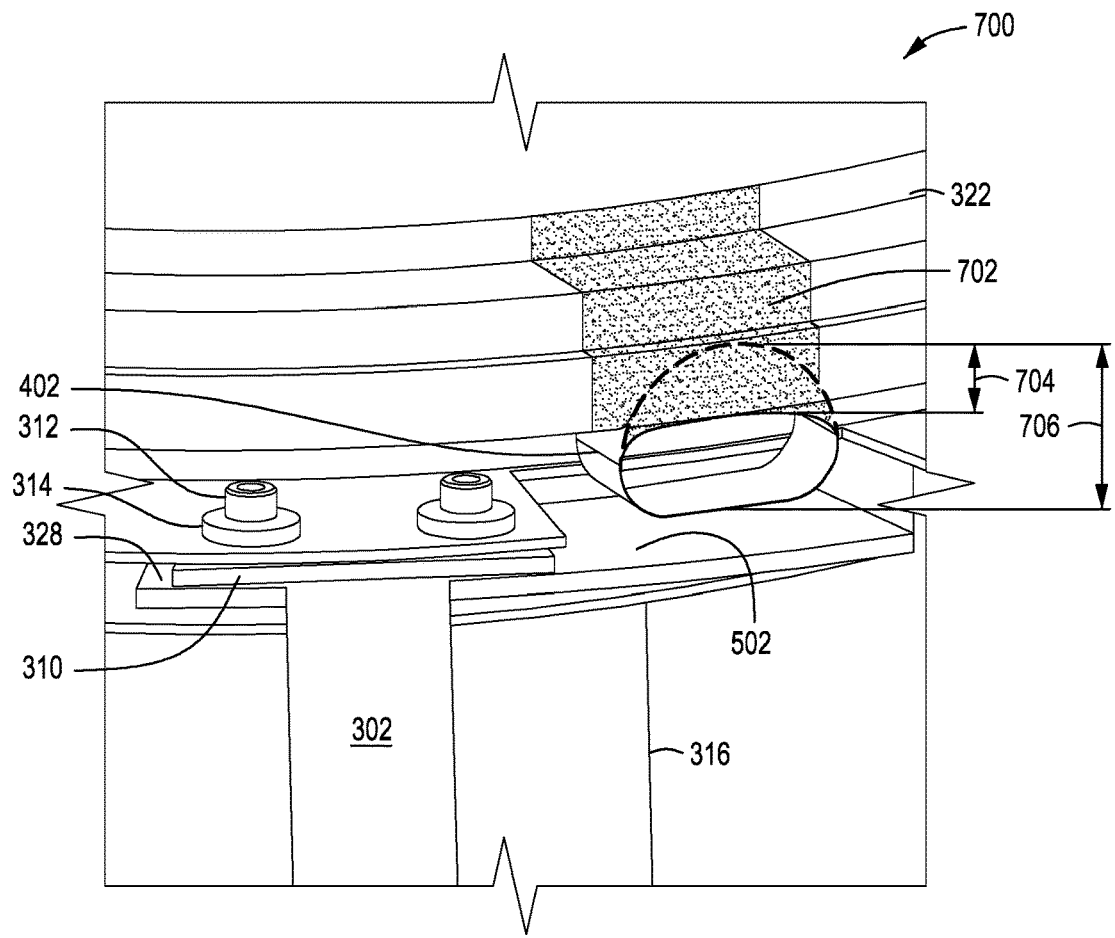
FIG. 7 depicts an isometric view of an in-situ cleaning bracket interfacing with a deposition ring in accordance with some embodiments of the present principles.
Figure 8:
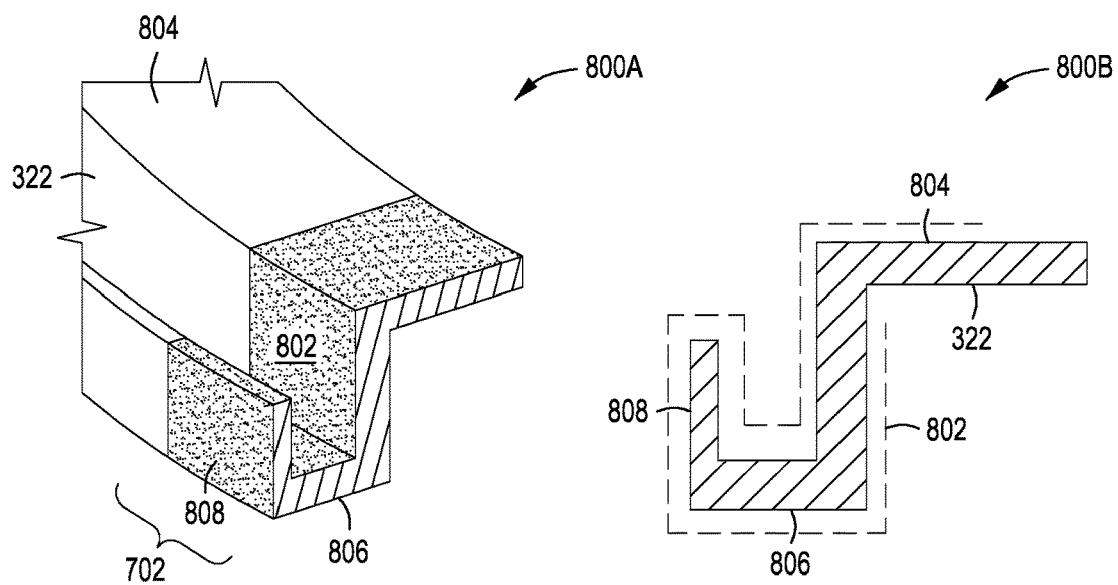
FIG. 8 depicts a partial isometric view and a cross-sectional view of a portion of a deposition ring with a coating applied to a contact portion in accordance with some embodiments of the present principles.
Figure 9:
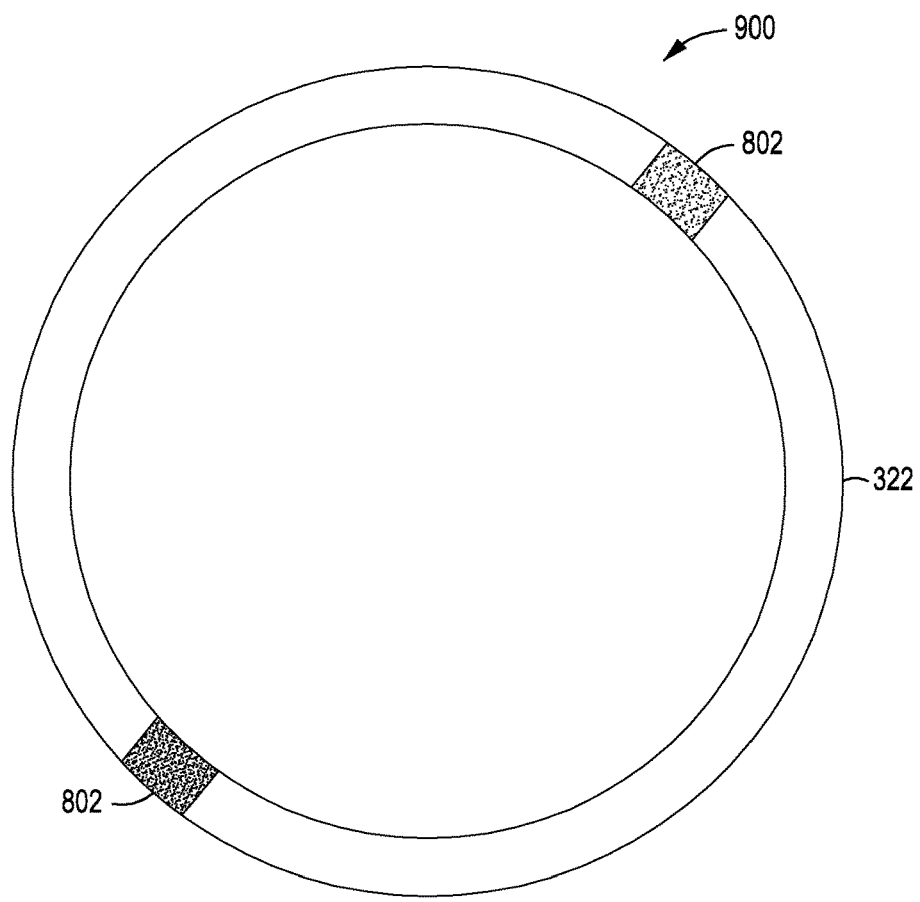
FIG. 9 depicts a top down view of a coating applied at more than one location on a deposition ring in accordance with some embodiments of the present principles.

FIG. 7 is an isometric view 700 of the in-situ cleaning bracket 302 interfacing with the deposition ring 322 while installed in a process chamber. In some embodiments, the at least one horizontal grounding loop 402 has a compression distance 704 of approximately 50% of a total loop height 706 of the at least one horizontal grounding loop 402 when coming into contact with the deposition ring 322. In some embodiments, the contact portion 702 of the deposition ring 322 may be coated or bead texturized with alumina to provide better electrical contact between any film depositions on an upper surface of the deposition ring 322 and the at least one horizontal grounding loop 402 contacting a lower surface of the deposition ring 322. FIG. 8 illustrates a partial isometric view 800A of a portion of the deposition ring 322 that has a coating 802 applied to the contact portion 702 of the deposition ring 322. In some embodiments, the coating 802 may cover a portion of an upper surface 804, a portion of a side 808, and a portion of a lower surface 806 of the deposition ring 322 as shown in a cross-sectional view 800B of FIG. 8. The coating 802 provides an enhanced electrical contact between films deposited on the upper surface 804 of the deposition ring 322 and the at least one horizontal grounding loop 402 which makes contact on the lower surface 806 of the deposition ring 322. In some embodiments, the coating 802 may be applied by a twin wire arc spray process to deposit alumina on the deposition ring 322 which, in some embodiments, is made of ceramic-based material. A twin wire arc spray process (TWAS) is an automated system for depositing a molten, high performance metal coating on a base material that may be subject to corrosion or erosion. In some embodiments, the coating 802 may be approximately ten thousandths of an inch thick. The coating 802 becomes a conductive ground path between deposition material on the deposition ring and the in-situ cleaning bracket 302 for the electrostatic cleaning process. In some embodiments as shown in a top down view 900 of FIG. 9, the coating 802 is applied at more than one location on the deposition ring 322. In the example, the coating 802 is applied at locations 180 degrees apart such that the deposition ring 322 may be installed (flipped around) in a process chamber with either portion making contact with at least one horizontal grounding loop 402 of the in-situ cleaning bracket 302.

Figure 10:
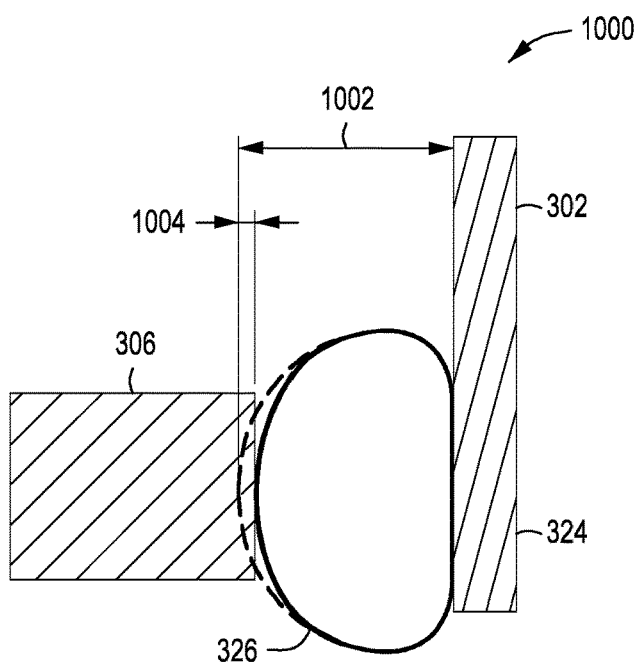
FIG. 10 depicts a cross-sectional view of a vertical grounding loop of a second end of an in-situ cleaning bracket in accordance with some embodiments of the present principles.

FIG. 10 depicts a cross-sectional view 1000 of the at least one vertical grounding loop 326 of the second end 324 of the in-situ cleaning bracket 302 coming into contact with the lift hoop 306. In some embodiments, the at least one vertical grounding loop 326 has a compression distance 1004 of approximately 5% to approximately 10% of a total loop height 1002 of the at least one vertical grounding loop 326 when coming into contact with the lift hoop 306. The inventors have found that high compression of grounding loops had the potential to cause particle generation in the process chamber. The inventors discovered that particle generation is avoided if the compression is minimized. Compression is used to compensate for various tolerances of combined parts to take up any slack for worst case 'stack-up tolerances' (each part has a tolerance range and when the parts are combined together, the tolerances add together or 'stack-up'). In some embodiments, the at least one vertical grounding loop 326 may be up to approximately twice as thick as the at least one horizontal grounding loop 402 due to the vertical motion and loading of the lift hoop 306 sliding across the at least one vertical grounding loop 326.

Figure 12:
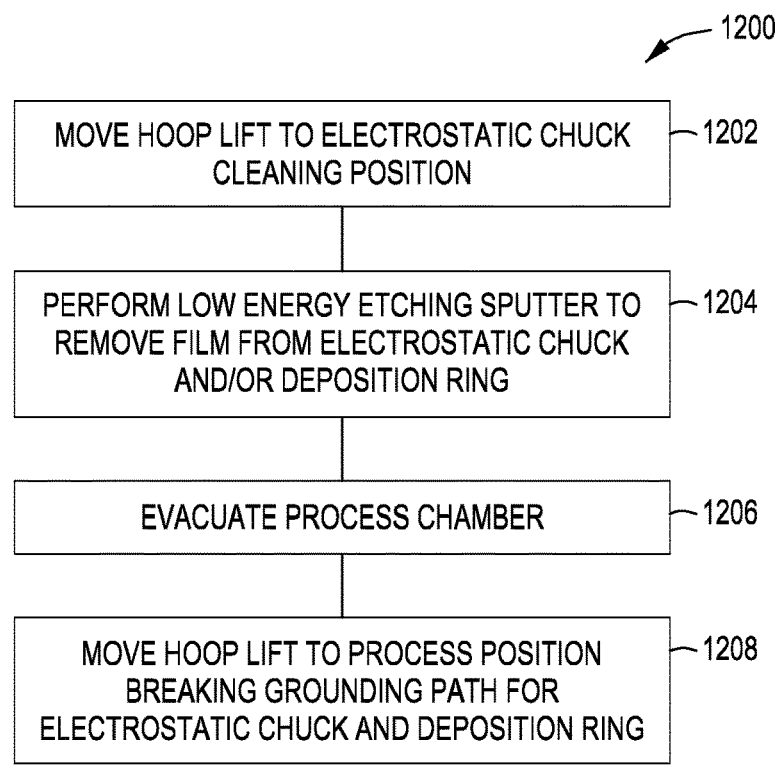
FIG. 12 depicts a method of performing an in-situ cleaning process of an electrostatic chuck in accordance with some embodiments of the present principles.

FIG. 12 is a method 1200 of performing an in-situ cleaning process of an electrostatic chuck according to some embodiments. In block 1202, a controller for a process chamber equipped with the apparatus described above moves a lift hoop to an electrostatic cleaning position (see, e.g., 1104 of FIG. 11) which grounds the deposition ring and the electrostatic chuck through an in-situ cleaning bracket and the lift hoop. In block 1204, the controller then performs a low energy etching sputter to remove film from the electrostatic chuck and/or deposition ring. No DC ion power is used during the etching process. In block 1206, the process chamber is evacuated to remove any particles or gases from the process chamber after the cleaning process. In block 1208, the controller moves the lift hoop to a process position. The process position breaks the grounding path for the deposition ring and the electrostatic chuck such that the deposition ring and the electrostatic chuck change from a ground potential to a floating potential, allowing further processing in the process chamber.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for cleaning an electrostatic chuck (ESC) in a semiconductor chamber, comprising:
   a deposition ring surrounding a perimeter of and electrically connected to the ESC;
   an adapter or cover ring surrounding and interfacing with an outer perimeter of the deposition ring, the adapter or cover ring is electrically isolated from the deposition ring;
   an annular grounding bracket configured to be mounted to and surrounding a pedestal, the annular grounding bracket has at least one horizontal grounding loop on an upper perimeter surface which is configured to provide electrical contact with the adapter or cover ring and to provide an RF (radio frequency) return path to the ESC during plasma generation; and
   a bracket with at least one horizontal grounding loop on an upper surface of a first end configured to make electrical contact with the deposition ring and at least one vertical grounding loop on a side surface of a second end that is distal to the first end and configured to make electrical contact with a lift hoop which is electrically grounded, the bracket is configured to be mounted to, but electrically isolated from, the annular grounding bracket.

2. The apparatus of claim 1, wherein the deposition ring has at least one portion of at least one surface of the deposition ring coated with aluminum deposited by a twin wire arc spray, the at least one portion of at least one surface of the deposition ring configured to contact the at least one horizontal grounding loop of the bracket.

3. The apparatus of claim 2, wherein the at least one portion of at least one surface of the deposition ring includes a portion of a top surface and a portion of a bottom surface of the deposition ring.

4. The apparatus of claim 1, wherein the first end of the bracket is configured to be mounted to the annular grounding bracket using at least one insulative spacer.

5. The apparatus of claim 4, wherein the at least one insulative spacer is a ceramic material.

6. The apparatus of claim 1, wherein fasteners used to mount the bracket to the annular grounding bracket are surrounded by ceramic sleeves that are configured to maintain electrical isolation between the bracket and the annular grounding bracket.

7. The apparatus of claim 1, wherein the at least one horizontal grounding loop of the bracket is configured to compress approximately 50% when in contact with the deposition ring.

8. The apparatus of claim 1, wherein the at least one vertical grounding loop of the bracket is configured to compress approximately 5% to approximately 10% when in contact with the lift hoop.

9. The apparatus of claim 1, wherein the annular grounding bracket has at least six horizontal grounding loops.

10. The apparatus of claim 1, wherein the at least one horizontal grounding loop of the bracket is radially inward of the at least one horizontal grounding loop of the annular grounding bracket.

11. The apparatus of claim 1, wherein the annular grounding bracket is made of stainless steel.

12. An apparatus for cleaning an electrostatic chuck (ESC) when installed in a semiconductor chamber, comprising:
   an elongated bracket formed of stainless steel with a horizontal surface at a first end and a vertical surface at a second end distal to the first end, the elongated bracket configured to be mounted in a vertical position when installed in the semiconductor chamber and to be mounted to, but electrically isolated from, an annular grounding bracket at the first end;
   at least one first grounding loop electrically connected to the horizontal surface of the first end and configured to make electrical contact by compression when contacting a deposition ring; and
   at least one second grounding loop electrically connected to the vertical surface of the second end and configured to make electrical contact by compression when contacting a lift hoop.

13. The apparatus of claim 12, wherein the first end of the elongated bracket is configured to be mounted to the annular grounding bracket using at least one insulative spacer.

14. The apparatus of claim 13, wherein the at least one insulative spacer is a ceramic material.

15. The apparatus of claim 12, wherein the elongated bracket is configured to use fasteners to mount the elongated bracket to the annular grounding bracket that are surrounded by ceramic sleeves that are configured to maintain electrical isolation between the elongated bracket and the annular grounding bracket.

16. The apparatus of claim 12, wherein the at least one first grounding loop of the elongated bracket is configured to compress approximately 50% when contacting the deposition ring.

17. The apparatus of claim 12, wherein the at least one second grounding loop of the elongated bracket is configured to compress approximately 5% to approximately 10% when in contact with the lift hoop.

18. The apparatus of claim 12, wherein the at least one first grounding loop of the elongated bracket is configured to be radially inward of at least one horizontal grounding loop of the annular grounding bracket when installed in the semiconductor chamber.

19. An apparatus for cleaning an electrostatic chuck (ESC) in a semiconductor chamber, comprising:
   a deposition ring surrounding a perimeter of and electrically connected to the ESC;
   an adapter or cover ring surrounding and interfacing with an outer perimeter of the deposition ring, the adapter or cover ring is electrically isolated from the deposition ring;
   an annular grounding bracket is configured to be mounted to and surrounding a pedestal, the annular grounding bracket has at least one horizontal grounding loop on an upper perimeter surface which is configured to provide electrical contact with the adapter or cover ring and to provide an RF (radio frequency) return path to the ESC during plasma generation;
   a bracket with at least one horizontal grounding loop on an upper surface of a first end configured to make electrical contact with the deposition ring and at least one vertical grounding loop on a side surface of a second end that is distal to the first end and configured to make electrical contact with a lift hoop which is electrically grounded, the bracket is configured to be mounted to, but electrically isolated from, the annular grounding bracket; and
   a controller configured to perform an in-situ cleaning process of the ESC by:
      moving the lift hoop to a position that contacts the at least one vertical grounding loop of the bracket to ground the ESC and deposition ring through the bracket;
      forming a plasma in the semiconductor chamber with an RF bias applied to the ESC with an RF return path formed by the adapter or cover ring, annular grounding bracket, and the pedestal; and
      etching with the plasma a process film buildup from at least a portion of a surface of the deposition ring and at least a portion of a surface of the ESC to perform in-situ cleaning of the ESC and the deposition ring.

20. The apparatus of claim 19, wherein the deposition ring has at least one portion of at least one surface of the deposition ring coated with aluminum, the at least one portion of at least one surface of the deposition ring configured to contact the at least one horizontal grounding loop of the bracket.

* * * * *